United States Patent
Coppa et al.

(10) Patent No.: US 10,773,282 B2
(45) Date of Patent: Sep. 15, 2020

(54) CONTROLLING DRY ETCH PROCESS CHARACTERISTICS USING WAFERLESS DRY CLEAN OPTICAL EMISSION SPECTROSCOPY

(71) Applicant: Tokyo Electron Limited, Tokyo (JP)

(72) Inventors: Brian J. Coppa, Eagle, ID (US); Deepak Vedhachalam, Boise, ID (US); Francois C. Dassapa, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 341 days.

(21) Appl. No.: 15/469,303

(22) Filed: Mar. 24, 2017

(65) Prior Publication Data
US 2017/0282223 A1    Oct. 5, 2017

Related U.S. Application Data

(60) Provisional application No. 62/316,021, filed on Mar. 31, 2016.

(51) Int. Cl.
*B08B 7/00* (2006.01)
*B08B 9/08* (2006.01)
(Continued)

(52) U.S. Cl.
CPC .......... *B08B 7/0035* (2013.01); *B08B 9/0865* (2013.01); *G01N 21/73* (2013.01); *G01N 21/94* (2013.01); *H01J 37/32146* (2013.01); *H01J 37/32669* (2013.01); *H01J 37/32697* (2013.01); *H01J 37/32862* (2013.01); *H01J 37/32972* (2013.01); *H01J 37/32981* (2013.01); *H01L 21/67023* (2013.01); *H01L 21/67069* (2013.01); *H01L 22/12* (2013.01); *H01J 2237/335* (2013.01)

(58) Field of Classification Search
None
See application file for complete search history.

(56) References Cited

U.S. PATENT DOCUMENTS 3,059,611 A    10/1962 Fury et al.
3,612,692 A    10/1971 Kruppa et al.
(Continued)

FOREIGN PATENT DOCUMENTS

CN    101038860 A    9/2007
CN    101221891 A    7/2008
(Continued)

OTHER PUBLICATIONS

International Preliminary Report on Patentability dated Oct. 11, 2018 in International Application No. PCT/US2017/024138, filed Mar. 24, 2017 15 pp.
(Continued)

*Primary Examiner* — Shamim Ahmed
(74) *Attorney, Agent, or Firm* — Oblon, McClelland, Maier & Neustadt, L.L.P.

(57) ABSTRACT

Described herein are architectures, platforms and methods for acquiring optical emission spectra from an optical emission spectroscopy system by flowing a dry cleaning gas into a plasma processing chamber of the plasma processing system and igniting a plasma in the plasma processing chamber to initiate the waferless dry cleaning process.

16 Claims, 7 Drawing Sheets

(51) Int. Cl.
*H01J 37/32* (2006.01)
*H01L 21/67* (2006.01)
*G01N 21/73* (2006.01)
*G01N 21/94* (2006.01)
*H01L 21/66* (2006.01)

(56) References Cited

U.S. PATENT DOCUMENTS

| | | |
|---|---|---|
| 4,147,435 A | 4/1979 | Habegger |
| 5,014,217 A | 5/1991 | Savage |
| 5,308,414 A | 5/1994 | O'Neill et al. |
| 5,347,460 A | 9/1994 | Gifford et al. |
| 5,353,790 A | 10/1994 | Jacques et al. |
| 5,450,205 A | 9/1995 | Sawin et al. |
| 5,648,198 A | 7/1997 | Shibata |
| 5,751,416 A | 5/1998 | Singh et al. |
| 5,885,472 A | 3/1999 | Miyazaki et al. |
| 5,980,767 A | 11/1999 | Koshimizu et al. |
| 6,060,328 A | 5/2000 | En et al. |
| 6,081,334 A | 6/2000 | Grimbergen et al. |
| 6,090,302 A | 7/2000 | Smith, Jr. et al. |
| 6,132,577 A | 10/2000 | Smith, Jr. et al. |
| 6,374,832 B2 | 4/2002 | Chow et al. |
| 6,381,008 B1 | 4/2002 | Branagh et al. |
| 6,535,779 B1 | 3/2003 | Birang et al. |
| 6,564,114 B1 | 5/2003 | Toprac et al. |
| 6,582,618 B1 | 6/2003 | Toprac et al. |
| 6,703,250 B2 | 3/2004 | Chiu |
| 6,745,095 B1 | 6/2004 | Ben-Dov et al. |
| 6,815,653 B2 | 11/2004 | Tsay et al. |
| 6,825,920 B2 | 11/2004 | Lam et al. |
| 6,830,939 B2 | 12/2004 | Harvey et al. |
| 6,911,157 B2 | 6/2005 | Edamura et al. |
| 6,958,484 B2 | 10/2005 | Mitrovic |
| 7,241,397 B2 | 7/2007 | Fink et al. |
| 7,312,865 B2 | 12/2007 | Chen |
| 7,328,126 B2 | 2/2008 | Chamness |
| 7,334,477 B1 | 2/2008 | Pirkle |
| 7,591,923 B2 | 9/2009 | Mitrovic et al. |
| 7,959,970 B2 | 6/2011 | Gaudet et al. |
| 8,048,326 B2 | 11/2011 | Yue et al. |
| 8,154,721 B2 | 4/2012 | Chen et al. |
| 8,158,017 B2 | 4/2012 | Hudson |
| 8,173,451 B1 | 5/2012 | Tian et al. |
| 8,415,884 B2 | 4/2013 | Chen et al. |
| 8,416,509 B2 | 4/2013 | Yi et al. |
| 8,513,583 B2 | 8/2013 | Corke et al. |
| 8,553,218 B2 | 10/2013 | Tinnemans et al. |
| 8,877,080 B2 | 11/2014 | Chen et al. |
| 8,883,024 B2 | 11/2014 | Chen et al. |
| 9,200,950 B2 | 12/2015 | Lian et al. |
| 9,760,008 B2 | 9/2017 | Devilliers |
| 9,842,726 B2 | 12/2017 | Daniels et al. |
| 2001/0046769 A1 | 11/2001 | Chow et al. |
| 2002/0029851 A1 | 3/2002 | Edamura et al. |
| 2003/0132195 A1 | 7/2003 | Edamura et al. |
| 2004/0008336 A1 | 1/2004 | Lam et al. |
| 2004/0058359 A1 | 3/2004 | Mei et al. |
| 2004/0104681 A1 | 6/2004 | Mitrovic |
| 2004/0235303 A1 | 11/2004 | Wong et al. |
| 2005/0224458 A1* | 10/2005 | Gaudet .............. B08B 7/0035 216/67 |
| 2005/0241669 A1 | 11/2005 | Wodecki |
| 2006/0006139 A1 | 1/2006 | Johnson et al. |
| 2006/0051968 A1* | 3/2006 | Joshi .............. H01J 37/3266 438/723 |
| 2006/0191482 A1* | 8/2006 | Kanno .............. H01J 37/32935 118/725 |
| 2007/0128876 A1 | 6/2007 | Fukiage |
| 2007/0163617 A1* | 7/2007 | Ozaki .............. B08B 7/0035 134/1.1 |
| 2007/0238199 A1 | 10/2007 | Yamashita |
| 2008/0186473 A1 | 8/2008 | Lee |
| 2009/0065025 A1 | 3/2009 | Urbanowicz et al. |
| 2009/0280581 A1 | 11/2009 | Hudson |
| 2009/0325387 A1 | 12/2009 | Chen et al. |
| 2010/0081285 A1 | 4/2010 | Chen et al. |
| 2011/0139748 A1 | 6/2011 | Donnelly et al. |
| 2011/0174776 A1 | 7/2011 | Kabe et al. |
| 2012/0006351 A1 | 1/2012 | Jun et al. |
| 2012/0085494 A1 | 4/2012 | Uchida et al. |
| 2012/0091097 A1 | 4/2012 | Chen et al. |
| 2012/0175060 A1 | 7/2012 | Hudson et al. |
| 2013/0016344 A1 | 1/2013 | Bullock et al. |
| 2013/0141720 A1 | 6/2013 | Park et al. |
| 2015/0241272 A1 | 8/2015 | Lian et al. |
| 2016/0268108 A1 | 9/2016 | Daniels et al. |

FOREIGN PATENT DOCUMENTS

| | | |
|---|---|---|
| CN | 102282654 A | 12/2011 |
| CN | 103117202 B | 9/2015 |
| EP | 0 652 415 A1 | 10/1994 |
| JP | 2005-527984 A | 9/2005 |
| JP | 2016-541119 A | 12/2016 |
| KR | 10-2012-0126418 A | 11/2012 |
| TW | 589659 B | 6/2004 |
| WO | WO 02/091453 | 11/2002 |
| WO | WO 2005/111265 | 11/2005 |
| WO | 2015/130433 A1 | 9/2015 |

OTHER PUBLICATIONS

International Search Report & Written Opinion dated Aug. 18, 2017 in International Application No. PCT/US2017/024138, filed Mar. 24, 2017 18 pp.
International Search Report & Written Opinion dated Jun. 29, 2018 in International Application No. PCT/US2018/022253, filed Mar. 13, 2018 13 pp.
International Search Report and Written Opinion dated Mar. 12, 2018 in PCT/US2017/062316, 13 pp.
De Schepper, P. et al., "Pattern Roughness Mitigation of 22 nm Lines and Spaces: The Impact of a H2 Plasma Treatment", Plasma Processes and Polymers, Sep. 2014, 10 pp. [retrieved on Jun. 7, 2016] <DOI: 10.1002/ppap.201400078>.
Yamaguchi, T. et al., "Direct current superposed dual-frequency capacitively coupled plasmas in selective etching of SiOCH over SiC", Journal of Physics D Applied Physics, Dec. 2011, 25 pp. [retrieved on May 6, 2016] <DOI: 10.1088/0022-3727/45/2/025203>.
Office Action dated Sep. 19, 2018 in U.S. Appl. No. 15/453,555.
Ventzek, P. L. G., et al., "Formation, Nature, and Stability of the Arsenic-Silicon-Oxygen Alloy for Plasma Doping of Non-Planar Silicon Structures", Applied Physics Letters, vol. 105, 2014, pp. 262102-1-262102-5 with cover page.
White, D. A., "Multivariate Analysis of Spectral Measurements for the Characterization of Semiconductor Processes", Dissertation presented Apr. 2002, at Massachusetts Institute of Technology, pp. 1-357.
Goodlin, B. E., "Multivariate Endpoint Detection of Plasma Etching Processes", Dissertation presented Apr. 2002, at Massachusetts Institute of Technology, pp. 1-226.
Yue, H. H., et al., "Plasma Etching Endpoint Detection Using Multiple Wavelengths for Small Open-Area Wafers", J. Vac. Sci. Technol. A, vol. 19, No. 1, 2001, pp. 66-75 with cover page.
White, D., et al., "Low-Open Area Endpoint Detection using a PCA based T2 Statistic and Q Statistic on Optical Emission Spectroscopy Measurements", IEEE Transactions on Semiconductor Manufacturing, vol. 13, No. 2, May 2000, pp. 1-30.
Goodlin, B. E., et al., "Quantitative Analysis and Comparison of Endpoint Detection Based on Multiple Wavelength Analysis", 201st Meeting of the Electrochemical Society, International Symposium on Plasma Processing XIV, Abs. 415, May 2002, pp. 1-30.
Master's Thesis of Jae-Wook Lee, presented at University of California, Berkeley, Jul. 1, 2000, 69 pages.
Shannon, S., et al., "A Spatially Resolved Optical Emission Sensor Plasma Etch Monitoring", Appl. Phys. Lett., vol. 71, No. 11, Sep. 15, 1997, pp. 1467-1468.

(56) References Cited

OTHER PUBLICATIONS

Selwyn, G. S., "Optical Diagnostic Techniques for Plasma Processing", AVS Press, 1993, Relevant chapter 3 on Optical Emission Spectroscopy (OES) is provided, pp. 26-80 with title and bibliographic information pages.
Notification of Examination Opinions dated May 11, 2018 in Taiwanese Patent Application No. 106110455 (with English language translation) 12 pages.
International Preliminary Report on Patentability and Written Opinion dated Sep. 26, 2019, in PCT/US2018/022253, 10 pages.

\* cited by examiner

| Recipe 402 | Step 406 | Etch time [sec] | Press [mT] | Power [W] HF | Power [W] LF | DC [-V] | N2 | O2 | RDC [%] | A-RDC C4F8 | A-RDC O2 | B.He [Tr] C, E | Temp Brine (deg.C) | ATCC [deg.C] |
|---|---|---|---|---|---|---|---|---|---|---|---|---|---|---|
| WLDC-Via-4 404 | O2 clean 408 | 20 410 | 400 | 200 | 0 | 0 | | 1500 | 50 | 0 | 0 | 0 | -10 | 25, 25 |
| | N2 clean | 10 | 200 | 700 | 0 | 0 | 480 | | 50 | 0 | 0 | 0 | -10 | 25, 25 |

CONTROLLING DRY ETCH PROCESS CHARACTERISTICS USING WAFERLESS DRY CLEAN OPTICAL EMISSION SPECTROSCOPY

RELATED APPLICATIONS

This application is based on and claims priority to U.S. Provisional Patent Application No. 61/316,021, entitled "METHOD FOR CONTROLLING DRY ETCH PROCESS CHARACTERISTICS USING WAFERLESS DRY CLEAN OPTICAL EMISSION SPECTROSCOPY" (Ref. No. TEA-136US1-PRO), filed on Mar. 31, 2016.

BACKGROUND

One of the problems with dry etch processes for via and trench features is the variation in the etch profile during the processing of a full lot of wafers. This may be due to the build-up of carbon (C) and fluorine (F) (collectively referred to as CF)-based etch gas constituents used for passivation and etch selectivity, which are used to form specific etch profiles for patterned wafers in semiconductor processing. If these constituents are not effectively removed from the chamber to the same degree during dry clean cycles between wafers, polymer deposition can accumulate in a chamber leading to the build-up of a film layer which can lead to particle formation and peeling, and can generate defects and device failure on a wafer. In addition, ineffective or inconsistent waferless dry cleaning (WLDC) of the chamber between device wafers, can lead to varying residual CF constituents in the chamber, which subsequently are introduced during a successive dry etch process of a device wafer that affects the uniformity of etch profile characteristics from one wafer lot to the next. The wafers making up a lot.

SUMMARY OF INVENTION

This invention relates to the optimization of a waferless dry clean (WLDC) process in order to reduce the dry etch wafer-to-wafer process variation of patterned device wafers of a lot. Optical Emission Spectroscopy (OES) is used to monitor light emission from a plasma, such as a dry cleaning process that is performed between each process wafer of a lot, to minimize deposition build-up in a plasma processing chamber. The OES of various constituents, such as chlorine (C) and fluorine (F) being exhausted during a dry clean cycle is indicative of the effectiveness of the cleaning process. The OES of the constituents can be used to gauge and optimize the WLDC process in order to improve etch wafer process control.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

FIG. 4 is an example flowchart that illustrates a particular dry clean process condition.

DETAILED DESCRIPTION

Figure 1:
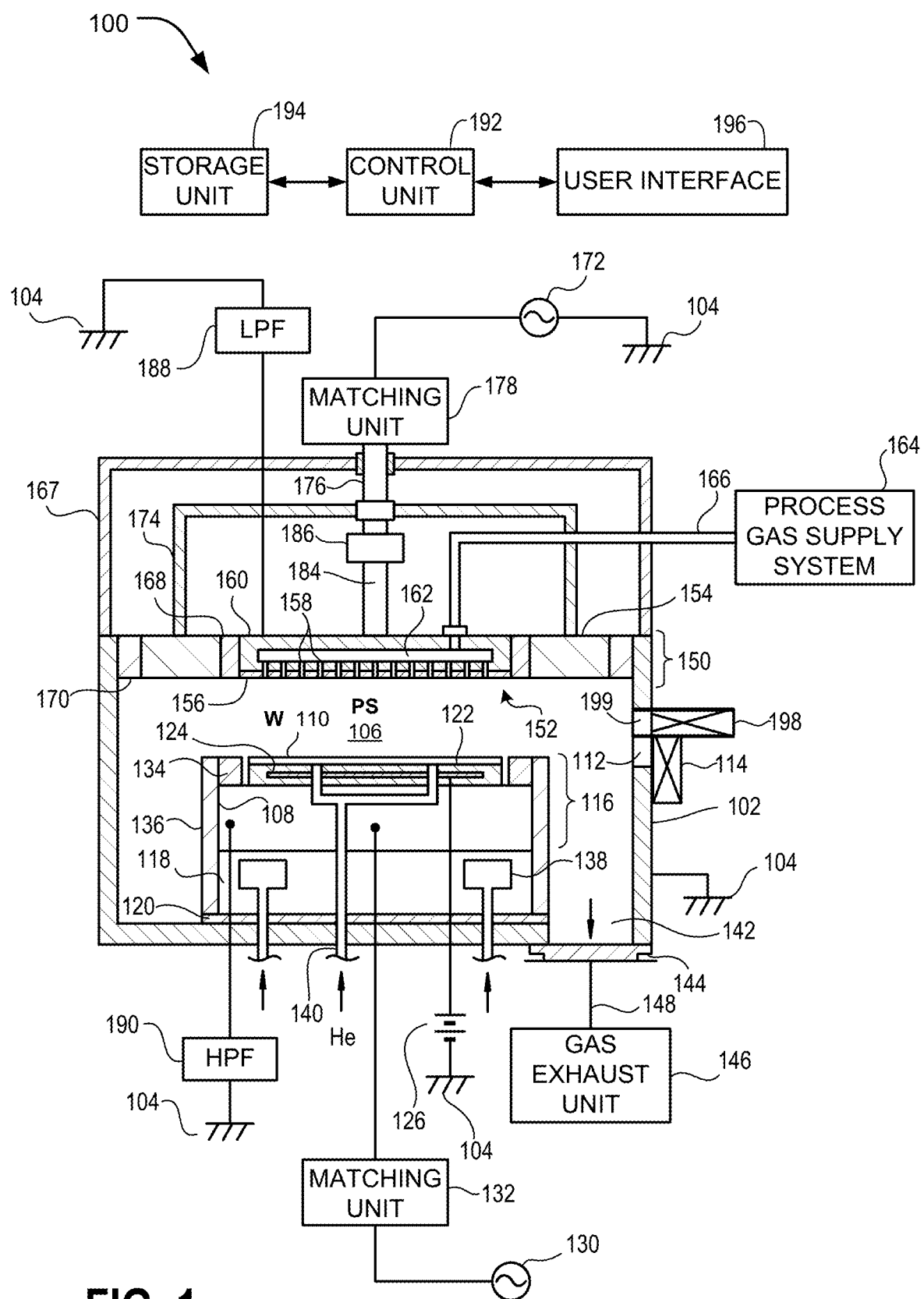
FIG. 1 is a cross-sectional view showing an example schematic configuration of a capacitively coupled plasma (CCP) processing system in accordance with embodiments herein.

Described herein are architectures, platforms and methods for analyzing residue constituents in a waferless dry clean (WLDC) process, and in particular analysis using Optical Emission Spectroscopy (OES). A process control monitor/metric such as OES can be utilized to analyze the effectiveness of a WLDC process by evaluation of carbon (C) and fluorine (F) based wavelengths in the spectra for a batch of wafers.

Moreover, a WLDC process can be optimized based on OES spectra of undesirable residue constituents being removed by the dry cleaning process following one particular device wafer process. Typically, an ineffective WLDC process will never show the leveling out in OES intensity for the wavelength examined of a constituent that is intended to be removed by the WLDC. However, the OES spectra of this constituent would show the leveling out in intensity once the endpoint was reached for the WLDC process; this endpoint time can be utilized for determining the ideal completion time for the WLDC process in order to optimize production throughput. In other words, by optimizing the WLDC process (e.g., minimizing the time to perform the WLDC process), optimal usage and production may be realized.

Wet cleans of a plasma processing chamber may be routinely performed. By optimizing the WLDC process, the time or period between such wet cleans may be also be optimized. Optimization of the herein described parameters for a WLDC process can maximize the time between wet cleans. Furthermore, useful life of components in a plasma processing chamber or system may be prolonged with an optimized WLDC process.

Furthermore, by reducing the variation in the C and F intensity levels between device wafers collectively for a wafer lot using a more optimal WLDC process, the uniformity of the etch profile characteristics of the wafer lot can be improved. Excess or inconsistent C and F constituents due to an inconsistent WLDC process can cause variations in the subsequent plasma etch performance for patterned device wafers that can lead to an insufficient critical dimension variation across patterned device wafers of a wafer lot.

OES can be used to optimize the consistency and effectiveness of a WLDC for removing undesirable remnant constituents resulting from a device wafer etch process.

Thus, OES of C and F based species in an OES spectra within a wafer lot are directly correlated to key metrics such as the etch profile uniformity of a device wafer lot. In addition, it has been found that bare silicon wafers exposed to the same etch process as a device wafer can be used to optimize the WLDC, since OES shows the same response and trends with respect to adjustment of WLDC process parameters. Examples of process parameters include, but are not limited to radio frequency (RF) or microwave power supplied to a plasma processing chamber of a plasma processing system; RF or microwave power pulse frequency supplied to the plasma processing chamber; RF or microwave pulse duty cycle to the plasma processing chamber; RF power supplied to a substrate holder in the plasma processing chamber; magnetic field of one of more magnets proximate the substrate holder; DC bias of the substrate holder; DC bias voltage supplied to at least one electrode arranged proximate the substrate holder; dry cleaning gas flow rate; wafer chuck temperature, dry cleaning gas pressure; and duration of the waferless dry cleaning process.

Improvement in a WLDC process for removal of C and F such as using a higher oxygen plasma power may be found between either bare silicon or device wafers based on the resulting OES spectra; allowing optimization of a WLDC process without consuming high-cost device wafers. In certain implementations, a dummy substrate or wafer may be used as described herein. Therefore, an optimal time for a WLDC process may be achieved, where a minimal time is determined for such a WLDC process. Furthermore, an optimal WLDC process can enhance etch profile wafer-to-wafer uniformity for wafer lots.

It has been found that OES can be used to optimize the consistency and effectiveness of a WLDC for removing undesirable remnant constituents resulting from a device wafer etch process. Thus, OES of C and F constituent spectra within a wafer lot are directly correlated to key metrics such as the wafer-to-wafer etch profile uniformity of a device wafer lot. In addition, it has been found that bare silicon wafers exposed to the same etch process as a device wafer, can be used to optimize the WLDC since OES shows the same response and trend with respect to adjustment of WLDC process parameters including but not limited to gas pressures, gas flows, plasma exposure time, plasma power, bias voltage, and temperature.

For example, improvement in a WLDC process for the removal of C and F and CF polymer deposition accomplished by using a higher oxygen plasma power may be found both in bare silicon and device wafers based on a resulting OES spectra; allowing optimization of a WLDC process without consuming high-cost device production wafers. Therefore, the use of higher oxygen plasma power accelerates the time (and subsequent wafer output) and lessens the cost for optimization of a WLDC based on OES analysis to determine the optimal WLDC process or device wafers to enhance the wafer-to-wafer etch profile uniformity within the wafer lot. The use of OES spectra analysis may also be found to be indicative of cleaning effectiveness for a wide variety of etch process conditions, as the variation in undesirable remnant species for a batch of wafers can be used to predict changes in the uniformity of subsequently formed etch profiles for multiple wafers within a wafer lot.

Furthermore, a more effective WLDC process reduces the need for additional bare silicon dummy wafers to be run between device wafers to achieve better etch process control to remove residue accumulating in a chamber or conditioning to stabilize the chamber environment; thus reducing overall process time and cost. In addition an optimal WLDC process that keeps the chamber cleaner long-term lessens the frequency of wet clean preventive maintenance cycles, which ultimately improves chamber utilization and productivity.

In certain instances, an etch process may introduce a wide variety of gas species into the chamber such as C and F, which ultimately lead to polymer deposition within the plasma processing chamber that can form particles within the plasma processing chamber and on the wafer surface. OES spectra can be collected during the subsequent clean to evaluate the gas species removed from the chamber during a WLDC process that runs in the chamber after processing a device wafer.

In comparison between a wafer lot having a process with a less effective WLDC process with less effective residual constituent (CF) removal, versus a wafer lot having a more effective WLDC process with more effective residual constituent (CF) removal, the less effective WLDC process may not show a leveling out of OES intensity for the F wavelength examined over WLDC process time. In contrast, the more effective WLDC process can indicate an OES endpoint for this exact same F constituent for all WLDC processes occurring between each device wafer etch process for the lot that could be categorized as a clean condition for the chamber. In addition, particle monitor wafers may be cycled through the plasma processing chamber before and after each wafer lot to analyze particle levels. A long-term benefit of a more effective WLDC process may be seen in reducing increasing trends of particle levels in a chamber, since polymer deposition can accumulate over time leading to peeling from chamber surfaces for an insufficient WLDC.

For a more effective WLDC process, when using higher oxygen or O2 pressure, higher O2 power and higher bias voltage may significantly improve within-lot etch uniformity. A reduction in the range and standard deviation of the means of the bottom via critical dimension or CD of an etch profile across a lot of wafers may be realized with the more effective WLDC. Furthermore, a wafer lot using this more effective WLDC may also have a lower within-wafer etch uniformity for various CDs such as a bottom via width CD. Particle levels may reduce for the more effective WLDC in addition to less added defects being measured for the wafer lot with the enhanced WLDC process. A need for adding additional bare silicon dummy chamber conditioning wafers to be processed during overall wafer lot processing with a particular recipe may be eliminated, saving on overall wafer lot processing time.

OES analysis during the WLDC processes running between device wafers for wafer lots may show the more effective WLDC process operating at higher O2 pressure, higher O2 power and with DC bias voltage. A more effective and consistent F removal from the plasma processing chamber, as the main constituent remaining after a device wafer etch process, generated from higher power oxygen radicals and ions, may create a cleaner and more consistent environment in the plasma processing chamber for successive wafers in the wafer lot. The overall within-wafer and within-lot etch uniformity can improve. A one to one correlation may be realized between the reduction of the within-lot F variation in the WLDC OES and the reduction in the standard deviation of the mean bottom CD per wafer in the lot. For example, OES WLDC processes can be used as an in-situ diagnostic to enhance etch process control, when OES WLDC processes are linked with process automation features of plasma processing systems/chambers to optimize etch uniformity in a manufacturing fab.

In addition, other optical diagnostic methods, such as laser induced fluorescence (LIF), laser interferometry, mass spectrometry, residual gas analysis, FTIR, etc., can be used instead of OES for monitoring the WLDC process with the same or similar outcome.

FIG. 1 shows a schematic cross-sectional view of an example of a capacitively coupled plasma (CCP) processing apparatus or plasma processing system 100 in accordance with embodiments herein. It is to be understood that other processing systems can be implemented, such as radial line slot antenna (RLSA) and inductively coupled plasma (ICP) processing systems may be implemented. In particular implementations, the plasma processing system 100 is used for a WLDC process, which may implement an OES spectra analysis of residual constituents, such as C and F. Furthermore, plasma analysis may be performed. In addition, endpoint analysis may be performed. Duration of the WLDC process can be a parameter that may be optimized during a WLDC process using OES data of residual constituents.

The plasma processing system 100 may be used for multiple operations including ashing, etching, deposition, cleaning, plasma polymerization, plasma-enhanced chemical vapor deposition (PECVD), plasma-enhanced atomic layer deposition (PEALD) and so forth. Plasma processing can be executed within plasma processing chamber 102, which can be a vacuum chamber made of a metal such as aluminum or stainless steel. The plasma processing chamber 102 is grounded such to ground(s) 104. The plasma processing chamber 102 defines a processing vessel providing a process space PS 106 for plasma generation. An inner wall of the plasma processing chamber 102 can be coated with alumina, yttria, or other protectant. The plasma processing chamber 102 can be cylindrical in shape or have other geometric configurations.

At a lower, central area within the plasma processing chamber 102, a substrate holder or susceptor 108 (which can be disc-shaped) can serve as a mounting table on which, for example, a substrate W 110 to be processed (such as a semiconductor wafer) can be mounted. Substrate W 110 can be moved into the plasma processing chamber 102 through loading/unloading port 112 and gate valve 114. Susceptor 108 forms part of a lower electrode 116 (lower electrode assembly) as an example of a second electrode acting as a mounting table for mounting substrate W 110 thereon. Specifically, the susceptor 108 is supported on a susceptor support 118, which is provided at substantially a center of the bottom of plasma processing chamber 102 via an insulating plate 120. The susceptor support 118 can be cylindrical. The susceptor 108 can be formed of, e.g., an aluminum alloy. Susceptor 108 is provided thereon with an electrostatic chuck 122 (as part of the lower electrode assembly 116) for holding the substrate W 110. The electrostatic chuck 122 is provided with an electrode 124. Electrode 124 is electrically connected to DC power source 126 (direct current power source). The electrostatic chuck 122 attracts the substrate W 110 thereto via an electrostatic force generated when DC voltage from the DC power source 126 is applied to the electrode 124. DC bias of the substrate holder or susceptor 108, and DC bias voltage supplied to at least one of electrodes 116 and 124, can be parameters that may be optimized during a WLDC process using OES data of residual constituents.

The susceptor 108 can be electrically connected with a high-frequency power source 130 via a matching unit 132. This high-frequency power source 130 (a second power source) can output a high-frequency voltage in a range from, for example, 2 MHz to 20 MHz. Applying high frequency bias power causes ions, in the plasma, generated in the plasma processing chamber 102, to be attracted to substrate W 110. A focus ring 134 is provided on an upper surface of the susceptor 108 to surround the electrostatic chuck 122. In addition, RF or microwave power (not shown) may be provided to the plasma processing chamber 102. RF or microwave power supplied to the plasma processing chamber; RF or microwave power pulse frequency; RF or microwave pulse duty cycle; and RF power supplied to a substrate holder or susceptor 108, in the plasma processing chamber 102 can be parameters that may be optimized during a WLDC process using OES data of residual constituents.

An inner wall member 136, which can be cylindrical and formed of, e.g., quartz, is attached to the outer peripheral side of the electrostatic chuck 122 and the susceptor support 118. The susceptor support 118 includes a coolant flow path 138. The coolant flow path 138 communicates with a chiller unit (not shown), installed outside the plasma processing chamber 102. Coolant flow path 138 is supplied with coolant (cooling liquid or cooling water) circulating through corresponding lines. Accordingly, a temperature of the substrate W 110 mounted on/above the susceptor 108 can be accurately controlled. A gas supply line 140, which passes through the susceptor 108 and the susceptor support 118, is configured to supply heat transfer gas to an upper surface of the electrostatic chuck 122. A heat transfer gas (also known as backside gas) such as helium (He) can be supplied between the substrate W 110 and the electrostatic chuck 122 via the gas supply line 140 to assist in heating substrate W 110.

An exhaust path 142 can be formed along an outer periphery of inner wall member 136 and an inner sidewall surface of the plasma processing chamber 102. An exhaust port 144 (or multiple exhaust ports) is provided in a bottom portion of the exhaust path 142. A gas exhaust unit 146 is connected to each exhaust port via gas exhaust line 148. The gas exhaust unit 146 can include a vacuum pump such as a turbo molecular pump configured to decompress the plasma processing space within the plasma processing chamber 102 to a desired vacuum condition. The gas exhaust unit 146 evacuates the inside of the plasma processing chamber 102 to thereby depressurize an inner pressure thereof up to a desired degree of vacuum.

An upper electrode 150 (that is, an upper electrode assembly), is an example of a first electrode and is positioned vertically above the lower electrode 116 to face the lower electrode 116 in parallel. The plasma generation space or process space PS 106 is defined between the lower electrode 116 and the upper electrode 150. The upper electrode 150 includes an inner upper electrode 152 having a disk shape, and an outer upper electrode 154 can be annular and surrounding a periphery of the inner upper electrode 152. The inner upper electrode 152 also functions as a processing gas inlet for injecting a specific amount of processing gas into the process space PS 106 above substrate W 110 mounted on the lower electrode 116.

More specifically, the inner upper electrode 152 includes electrode plate 156 (which is typically circular) having gas injection openings 158. Inner upper electrode 152 also includes an electrode support 160 detachably supporting an upper side of the electrode plate 156. The electrode support 160 can be formed in the shape of a disk having substantially a same diameter as the electrode plate 156 (when electrode plate 156 is embodied as circular in shape). In alternative embodiments, electrode plate 156 can be square, rectangular, polygonal, etc. The electrode plate 156 can be formed of a conductor or semiconductor material, such as Si, SiC, doped Si, Aluminum, and so forth. The electrode plate 156 can be integral with upper electrode 150 or detachably supported by electrode support 160 for convenience in replacing a given plate after surface erosion. The upper electrode 150 can also include a cooling plate or cooling mechanism (not shown) to control temperature of the electrode plate 156.

The electrode support 160 can be formed of, e.g., aluminum, and can include a buffer chamber 162. Buffer chamber 162 is used for diffusing process gas and can define a disk-shaped space. Processing gas from a process gas supply system 164 supplies gas to the upper electrode 150. The process gas supply system 164 can be configured to supply a processing gas for performing specific processes, such as film-forming, etching, and the like, on the substrate W 110. The process gas supply system 164 is connected with a gas supply line 166 forming a processing gas supply path. The gas supply line 166 is connected to the buffer chamber 162 of the inner upper electrode 152. The processing gas can then move from the buffer chamber 162 to the gas injection openings 158 at a lower surface thereof. A flow rate of processing gas introduced into the buffer chamber 162 can be adjusted by, e.g., by using a mass flow controller. Further, the processing gas introduced is uniformly discharged from the gas injection openings 158 of the electrode plate 156 (showerhead electrode) to the process space PS 106. The inner upper electrode 152 then functions in part to provide a showerhead electrode assembly. Dry cleaning gas flow rate, and dry cleaning gas pressure can be parameters that may be optimized during a WLDC process using OES data of residual constituents. Dry cleaning gases can include oxygen, an oxygen-containing gas, HCl, F2, Cl2, hydrogen, nitrogen, argon, SF6, C2F6, NF3, CF4, or a mixture of two or more of such gases.

A dielectric 168, having a ring shape, can be interposed between the inner upper electrode 152 and the outer upper electrode 154. An insulator 170, which can be a shield member having a ring shape and being formed of, e.g., alumina, is interposed between the outer upper electrode 154 and an inner peripheral wall of the plasma processing chamber 102 in an air tight manner.

The outer upper electrode 154 is electrically connected with a high-frequency power source 172 (first high-frequency power source) via a power feeder 174, an upper power feed rod 176, and a matching unit 178. The high-frequency power source 172 can output a high-frequency voltage having a frequency of 13 MHz (megahertz) or higher (e.g. 60 MHz), or can output a very high frequency (VHF) voltage having a frequency of 30-300 MHz. This power source 172 can be referred to as the main power supply as compared to a bias power supply. The power feeder 174 can be formed into, e.g., a substantially cylindrical shape having an open lower surface. The power feeder 174 can be connected to the outer upper electrode 154 at the lower end portion thereof. The power feeder 174 is electrically connected with the lower end portion of the upper power feed rod 176 at the center portion of an upper surface thereof. The upper power feed rod 176 is connected to the output side of the matching unit 178 at the upper end portion thereof. The matching unit 178 is connected to the high-frequency power source 172 and can match load impedance with the internal impedance of the high-frequency power source 172. Note, however, that outer upper electrode 154 is optional and embodiments can function with a single upper electrode.

Power feeder 174 can be cylindrical having a sidewall whose diameter is substantially the same as that of the plasma processing chamber 102. The ground conductor 180 is connected to the upper portion of a sidewall of the plasma processing chamber 102 at the lower end portion thereof. The upper power feed rod 176 passes through a center portion of the upper surface of the ground conductor 180. An insulating member 182 is interposed at the contact portion between the ground conductor 180 and the upper power feed rod 176.

The electrode support 160 is electrically connected with a lower power feed rod 184 on the upper surface thereof. The lower power feed rod 184 is connected to the upper power feed rod 176 via a connector. The upper power feed rod 176 and the lower power feed rod 184 form a power feed rod for supplying high-frequency electric power from the high-frequency power source 172 to the upper electrode 150. A variable condenser 186 is provided in the lower power feed rod 184. By adjusting the capacitance of the variable condenser 186, when the high-frequency electric power is applied from the high-frequency power source 160, the relative ratio of an electric field strength formed directly under the outer upper electrode 154 to an electric field strength formed directly under the inner upper electrode 172 can be adjusted. The inner upper electrode 152 of the upper electrode 150 is electrically connected with a low pass filter (LPF) 188. The LPF 188 blocks high frequencies from the high-frequency power source 172 while passing low frequencies from the high-frequency power source 130 to ground. A lower portion of the system, the susceptor 108, forming part of the lower electrode 120, is electrically connected with a high pass filter (HPF) 190. The HPF 190 passes high frequencies from the high-frequency power source 172 to ground.

High-frequency electric power in a range from about 3 MHz to 150 MHz, is applied from the high-frequency power source 172 to the upper electrode 150. This results in a high-frequency electric field being generated between the upper electrode 150 and the susceptor 108 or lower electrode 116. Processing gas delivered to process space PS 106 can then be dissociated and converted into a plasma. A low frequency electric power in a range from about 0.2 MHz to 20 MHz can be applied from the high-frequency power source 130 to the susceptor 108 forming the lower electrode 116. In other words, a dual frequency system can be used. As a result, ions in the plasma are attracted toward the susceptor 108, and thus anisotropy of etching is increased by ion assistance. Note that for convenience, FIG. 1 shows the high-frequency power source 172 supplying power to the upper electrode 150. In alternative embodiments, the high-frequency power source 172 can be supplied to the lower electrode 116. Thus, both main power (energizing power) and the bias power (ion acceleration power) can be supplied to the lower electrode.

Components of the plasma processing system 100 can be connected to, and controlled by, a control unit 192, which in turn can be connected to a corresponding storage unit 194 and user interface 196. Various plasma processing operations can be executed via the user interface 196, and various plasma processing recipes and operations can be stored in storage unit 194. Accordingly, a given substrate can be processed within the plasma processing chamber with various microfabrication techniques. In operation, the plasma processing apparatus uses the upper and lower electrodes to generate a plasma in the processing space PS 106. This generated plasma can then be used for processing a target substrate (such as substrate W 110 or any material to be processed) in various types of treatments such as plasma etching, chemical vapor deposition, treatment of glass material and treatment of large panels such as thin-film solar cells, other photovoltaic cells, and organic/inorganic plates for flat panel displays, etc. In certain implementations described herein, a dummy substrate, which may be a non-production wafer may be used as wafer W 110.

The control unit 192 may include one or more processors, microcomputers, computing units and the like. The storage unit 194 may include memory, and is an example of non-transitory computer-readable storage media for storing instructions which are executed by the control unit 192, to perform the various functions described herein. For example, the storage unit 194 may generally include both volatile memory and non-volatile memory (e.g., RAM, ROM, or the like). Memory may be referred to as memory or computer-readable storage media herein. Memory is capable of storing computer-readable, processor-executable program instructions as computer program code that may be executed by the control unit 190 as a particular machine configured for carrying out the operations and functions described in the implementations herein.

Memory may further store one or more applications (not shown). The applications may include preconfigured/installed and downloadable applications. In addition, memory may store the OES spectral data used for processes as described herein.

The plasma processing system 100 can further include a spectrometer 198 and a window 199. The spectrometer 196 is used for gathering light used for process endpoint analysis and OES spectra. The spectrometer 198 may be connected to control unit 192, or other controllers/systems.

Figure 2:
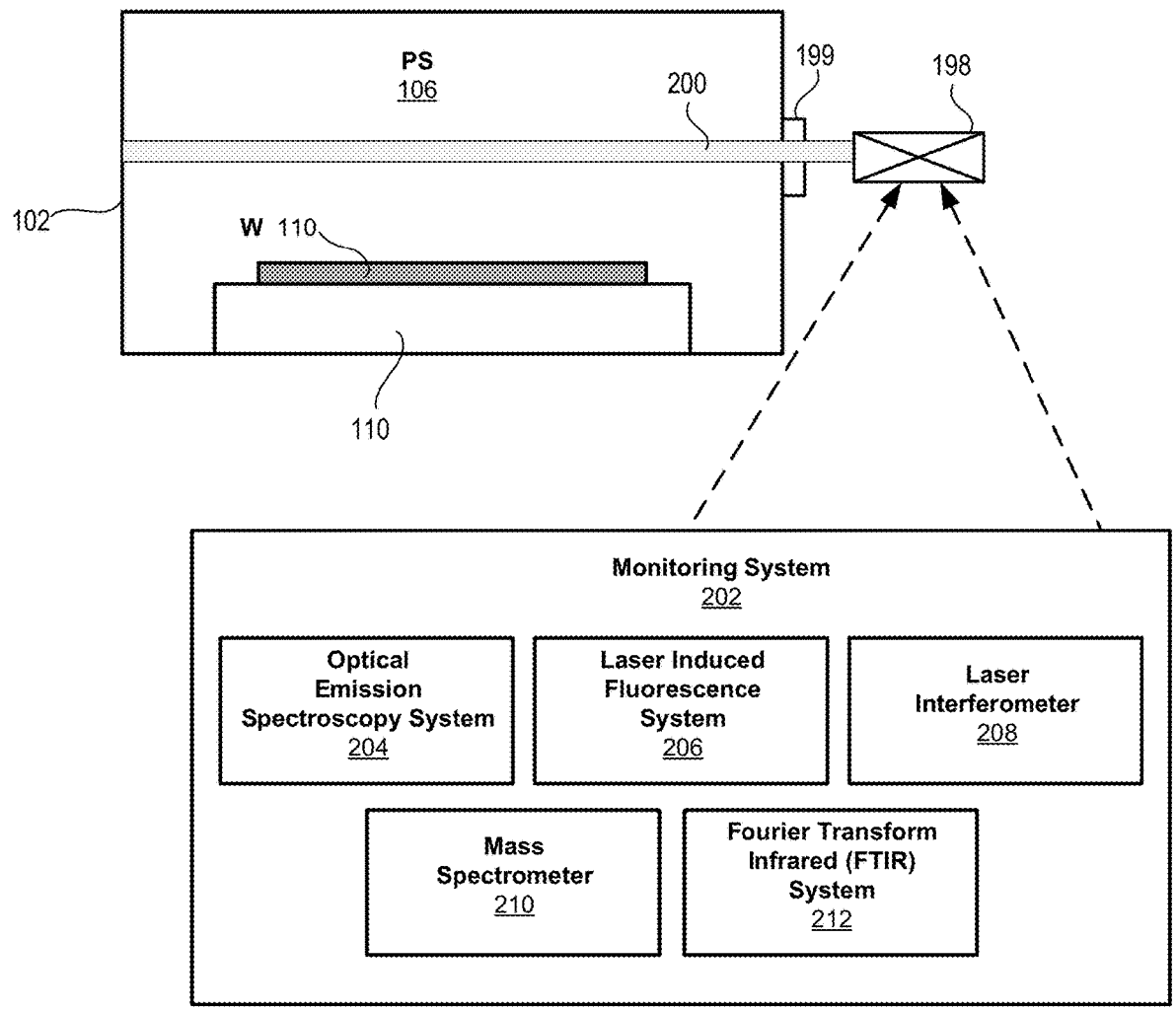
FIG. 2 is an example schematic block diagram of an example plasma processing system implementing optical emission spectroscopy (OES) to determine OES spectra, as part of an overall monitoring system to monitor gas constituents inside the plasma chamber.

FIG. 2 is an example schematic block diagram of an example plasma processing system implementing optical emission spectroscopy (OES) to determine OES spectra, and plasma monitoring. As discussed above, the plasma processing chamber 102 provides for the processing space PS 106 above the substrate W 110 mounted on the lower electrode 116. In a WLDC process to determine and gather OES spectra and/or endpoint calculation of residue constituents (e.g, CF), a production substrate W 110 may be absent. In other implementations, a dummy or non-production substrate is in place for substrate W 110.

In this example, the spectrometer 198 collects light, as represented by light volume 200. During the monitoring of OES spectra in a WLDC process, light volume 200 provides for the OES spectra data, which can include OES spectra of CF constituents.

The spectrometer 198 may be part of a monitoring system 202. The monitoring system may be part of the plasma processing system 100. The monitoring system 202 can be particularly used in plasma monitoring in the plasma processing chamber 102. Other example systems and components that can be part of monitoring system 202, include and are not limited to, an optical emission spectroscopy system 204, laser induced fluorescence system 206, laser interferometer 208, mass spectrometer 210, and Fourier transform infrared (FTIR) system 212. In particular, the spectrometer 196 can be part of the optical emission spectroscopy system 204. The optical emission spectroscopy system 204 may acquire OES during a WLDC process.

As discussed, a metric, such as OES spectra can be utilized to analyze the effectiveness of a WLDC process by evaluation of undesirable species or residual constituents, such as wavelengths of C and F constituents in an OES spectra for a batch or lot of wafers. Furthermore, a WLDC process can be optimized based on OES spectra of undesirable residue constituents being removed by the dry cleaning process following one particular device wafer process (in situ process). Typically, an ineffective WLDC process may not show the leveling out in OES intensity for the wavelength examined of a constituent that is intended to be removed by the WLDC process or even the feed-in dry cleaning gas such as oxygen. However, the OES spectra of this constituent can show the leveling out in intensity once the endpoint was reached for the WLDC process; this endpoint time can be utilized for determining the ideal completion time for the WLDC in order to optimize throughput. By reducing the variation in the C and F intensity levels between device wafers collectively for a lot using a more effective WLDC process, the uniformity of the etch profile characteristics of that lot can be improved such as the bottom via width (bottom critical dimension or CD). Excess or inconsistent CF or carbon densities in a chamber or polymer deposition build-up remaining from an inconsistent WLDC process can cause variations in the subsequent plasma etch performance for patterned device wafers that could lead to critical dimension variation across a lot outside the control limits for manufacturing specifications. These undesirable constituents residing in a chamber can lead to clogging of the features being etched during a subsequent device wafer etch process, which is the build-up of polymer residue in a trench or via feature which prevents uniform etching of a feature profile. Similarly, an accumulation of fluorine by-product in a chamber can lead to an increasing etch rate from one wafer to the next, since it tends to remove sidewall polymer passivation, which ultimately causes an increasing trend toward wider etch profiles. This mechanism was deemed the basis why a more effective WLDC process was found to improve wafer-to-wafer and within-wafer etch profile uniformity as well.

Figure 3:
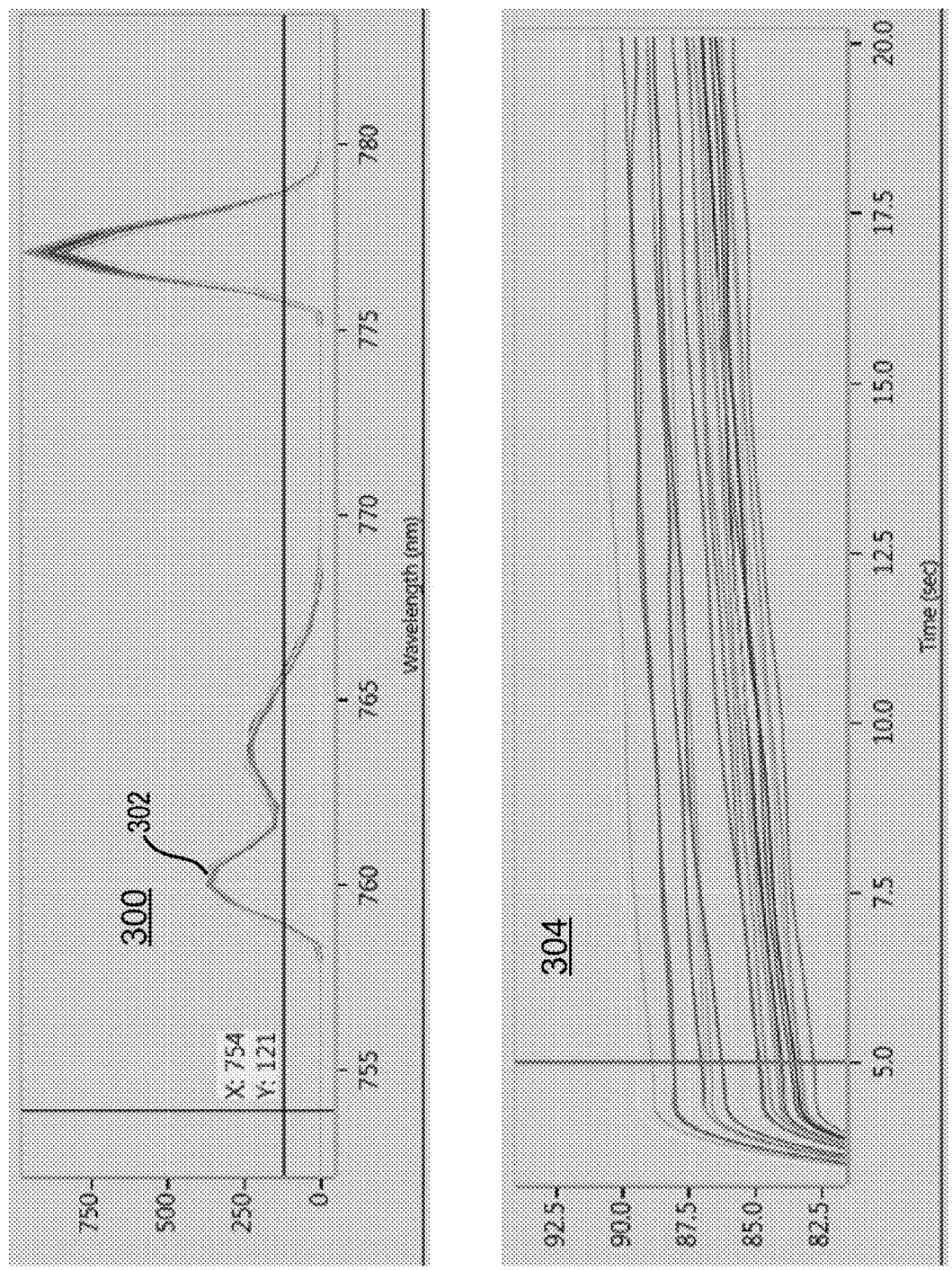
FIG. 3 are example graphs that illustrate a peak in optical emission spectroscopy (OES) spectra of a residual constituent fluorine (F) by-product during a non-optimized WLDC clean process and the constant increase of the amount of the residual constituent over the time period of the dry clean process.

FIG. 3 shows an example graph 300 that illustrate a peak in OES spectra of a residual constituent, and in particular fluorine (F). The OES spectral peak of fluorine for a particular WLDC is represented by 302 in graph 300. Using the intensity vs. time trend of a particular WLDC by-product OES peak such as fluorine, which happens to be shown in graph 304, and implementing an endpoint analysis, a determination may be made as to if and when the residual constituent fluorine levels off or not in a plasma processing chamber. Fluorine residual by-product background build-up within a chamber, as measured by OES, while processing wafers of a wafer lot involving polymer shrink based dry etching may cause an increasing trend in the etch profile width CD, as sidewall polymer is being removed to a higher degree for the same given etch process for consecutively processed device wafers of a lot. An endpoint analysis that may be implemented may be found in U.S. Pat. No. 9,330, 990 entitled "METHOD OF ENDPOINT DETECTION OF PLASMA ETCHING PROCESS USING MULTIVARIATE ANALYSIS" which is included in its entirety by reference.

It is realized that the plasma processing chamber is not absolutely devoid of residual constituents, and an acceptable amount of constituents may reside in the plasma processing chamber.

FIG. 4 shows an example chart 400 that provides optimized values for a particular dry clean process, such as a WLDC. In this example, OES spectra and endpoint analysis can be collected for residual constituent F. Several acronyms noted include: radical gas-distribution control (RDC) referring to the center to edge gas zone flow ratio/percent, brine or chiller temperature for the plasma system, direct current (DC) electrode voltage, low-frequency (LF) power, high-frequency (HF) power, and advanced temperature controlled chuck (ATCC) temperature in proximity to the substrate or wafer holder.

A particular process is identified under the heading "Recipe" as represented by 402. In this example, a WLDC process is identified as represented by 404. Step 406 furthers identifies the process as an oxygen (02) clean 408. A pre-set recipe time of 20 seconds 410 is identified as the maximum WLDC process time. Other parameters as shown in chart 400 may be identified for this optimized process. Such parameters can include "gas pressure", "power", "DC bias", etc.

Figure 5:
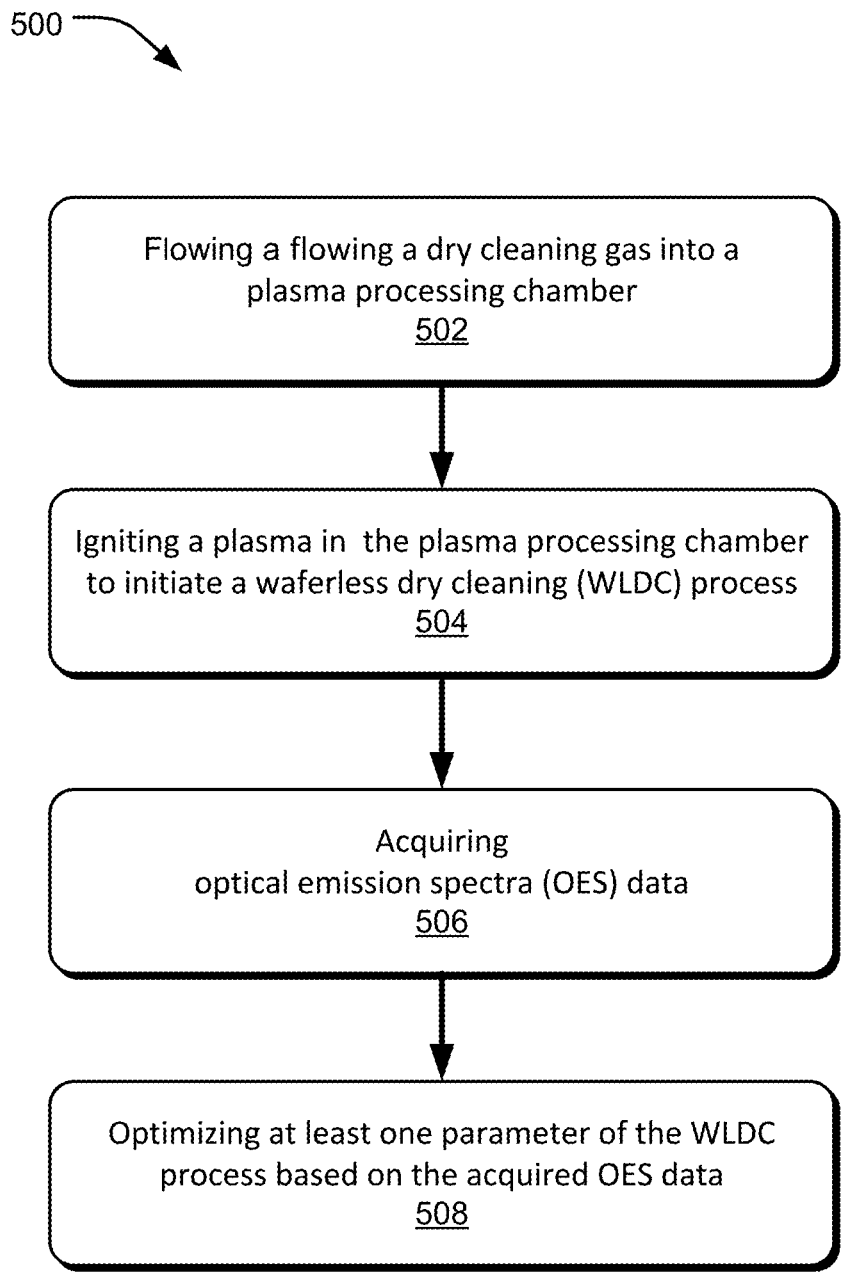
FIG. 5 is a process chart illustrating an example process flow for monitoring and controlling a waferless dry cleaning process in a plasma processing system based on optical emission spectroscopy (OES) as described herein.

FIG. 5 shows an example process 500 for monitoring and controlling a waferless dry cleaning process in a plasma processing system. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, flowing a dry cleaning gas into a plasma processing chamber is performed. In reference to FIG. 1 above, this block may be performed by the described components of plasma processing system 100.

At block 504, igniting a plasma in the plasma processing chamber to initiate a waferless dry cleaning (WLDC) process is performed. In reference to FIG. 1 above, this block may be performed by the described components of plasma processing system 100.

At block 506, acquiring optical emission spectra (OES) data is performed. In reference to FIG. 1 above, this block may be performed by the described components of plasma processing system 100. In addition, in reference to FIG. 2 above, this block may be performed by the optical emission spectroscopy system 204. In other implementations, the acquiring may be a monitoring act that monitors the plasma in the plasma processing chamber 102.

At block 508, optimizing at least one parameter of the WLDC process based on the acquired OES data. The parameters may be those described above. In addition, the parameters may be optimized in-situ or ex-situ.

Figure 6:
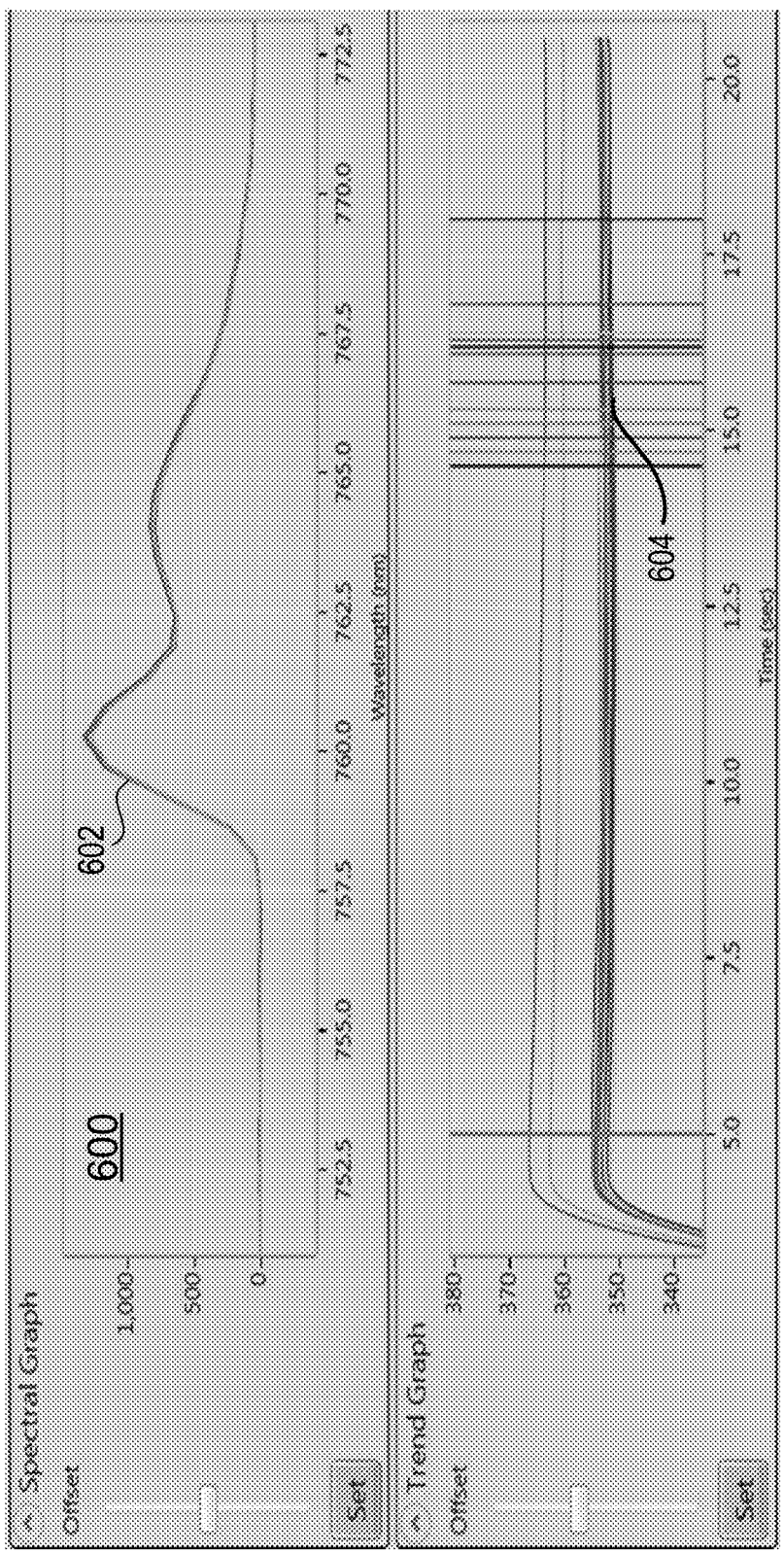
FIG. 6 is an example graph that illustrates optical emission spectroscopy (OES) detection of an endpoint for a residual fluorine (F) by-product constituent during an optimized waferless dry clean associated with clean chamber states.

FIG. 6 shows an example graph 600 of optical emission spectroscopy (OES) detection of a residual constituent for an optimized WLDC condition. The residual constituent F is represented by the OES peak 602. OES analysis is performed on residual constituent F as described herein indicating an OES endpoint by virtue of the leveling in intensity over time for this by-product. An array of OES endpoint time values 604 when the residual constituent F intensity stabilizes were found with steadily shorter times as the WLDC cleaned the chamber more and more of residual etch by-products such as fluorine over the course of wafer lot processing. These values may be used as the duration as to when a WLDC process (i.e., recipe) ends. The total variation in OES intensity of this F peak at the end of the optimized WLDC condition process time is reduced by 50 percent compared to the non-optimized WLDC OES spectra noted in FIG. 3; which subsequently led to over 50 percent less wafer-to-wafer via CD width variation across the lot.

Figure 7:
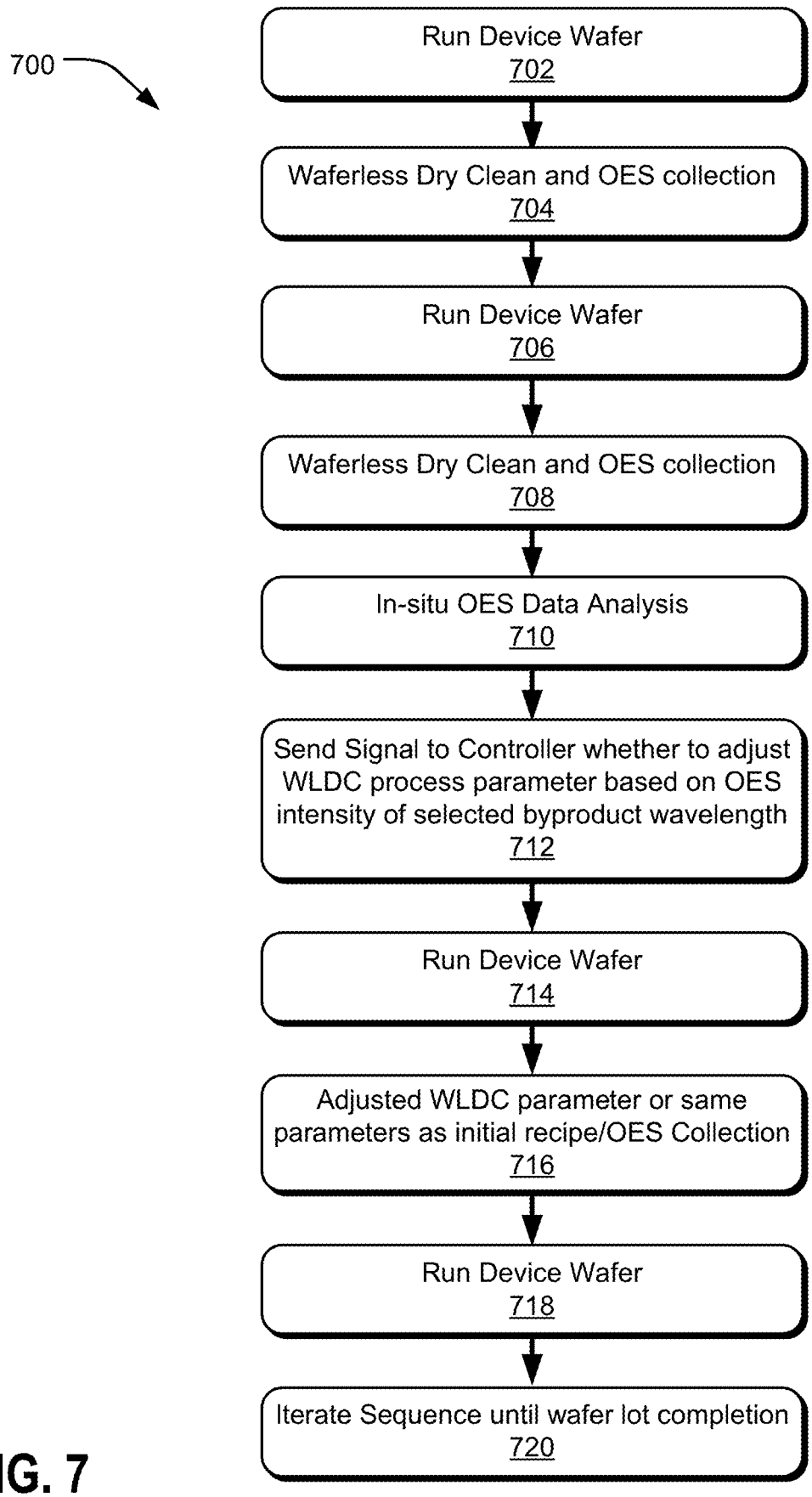
FIG. 7 is a process chart illustrating an example process flow for optical emission spectroscopy (OES) process control.

FIG. 7 shows an example process 700 for optical emission spectroscopy (OES) process control. In particular, the process 700 may be used for dry etch process control. Process 700 can be considered an in situ process, wherein in feedback may be sent to a plasma processing system, as described in reference to FIG. 1. Adjustment may be performed based on the determined feedback data.

The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 702, a production process of a wafer lot is performed. In reference to FIG. 1 above, this block may be performed by the described components of plasma processing system 100.

At block 704, a WLDC and OES trace data collection as described herein is performed. In reference to FIG. 1 and FIG. 2 above, this block may be performed by the described components of plasma processing system 100, and monitoring system 200.

At block 706, the production process of a wafer lot is continued. In reference to FIG. 1 above, this block may be performed by the described components of plasma processing system 100.

At block 708, a WLDC and OES trace data collection as described herein is performed. In reference to FIG. 1 and FIG. 2 above, this block may be performed by the described components of plasma processing system 100, and monitoring system 200.

At block 710, an in situ OES data analysis is performed. In reference to FIG. 1 above, this block may be performed by the described components of plasma processing system 100.

At block 712, data/signals are sent to the plasma processing system (i.e., controllers), to determine whether to adjust a WLDC process parameter based on OES intensity of the selected by-product (i.e., residual constituent) or cleaning feed gas wavelength.

At block 714, the production process of a wafer lot is continued. In reference to FIG. 1 above, this block may be performed by the described components of plasma processing system 100.

At block 716, an adjustment to the WLDC process parameters may be performed. Alternatively, the same parameters may be used. In reference to FIG. 1 above, this block may be performed by the described components of plasma processing system 100.

At block 718, the production process of a wafer lot is continued. In reference to FIG. 1 above, this block may be performed by the described components of plasma processing system 100.

At block 720, the sequence is iterated until the wafer lot production is complete. In reference to FIG. 1 above, this block may be performed by the described components of plasma processing system 100.

What is claimed is:

1. A method for monitoring and controlling a waferless dry cleaning process performed during processing of a lot of production substrates in a plasma processing system, the method comprising:

processing a first production substrate of the lot in a plasma processing chamber of the plasma processing system;

after removing the first production substrate from the plasma processing chamber, flowing a dry cleaning gas into the plasma processing chamber of the plasma processing system;

igniting a plasma in the plasma processing chamber to initiate a first instance of the waferless dry cleaning process;

acquiring, during the first instance of the waferless dry cleaning process, optical emission spectra from an optical emission spectroscopy system attached to the plasma processing chamber; and processing a second production substrate of the lot in the plasma processing chamber of the plasma processing system;

after removing the second production substrate from the plasma processing chamber, flowing the dry cleaning gas into the plasma processing chamber of the plasma processing system;

igniting a plasma in the plasma processing chamber to initiate a second instance of the waferless dry cleaning process;

acquiring, during the second instance of the waferless dry cleaning process, optical emission spectra from the optical emission spectroscopy system attached to the plasma processing chamber;

adjusting at least one parameter of the second instance of the waferless dry cleaning process based on the acquired optical emission spectra of the first instance of the waferless dry cleaning process to provide a consistent cleanliness level of the plasma processing chamber during processing of the lot of production substrates.

2. The method of claim 1, wherein the plasma processing system is a plasma etching system.

3. The method of claim 1, wherein the plasma processing system is a plasma deposition system.

4. The method of claim 1, wherein the acquiring of optical emission spectra is performed during a waferless dry cleaning process absent production substrates present in the plasma processing chamber.

5. The method of claim 4, wherein the acquiring of optical emission spectra is performed with dummy substrates placed in the plasma processing chamber.

6. The method of claim 1, wherein the at least one parameter of the waferless dry cleaning process is selected from the group consisting of:
   radio frequency (RF) or microwave power supplied to the plasma processing chamber;
   RF or microwave power pulse frequency;
   RF or microwave pulse duty cycle;
   RF power supplied to a substrate holder in the plasma processing chamber;
   magnetic field of one of more magnets proximate the substrate holder;
   direct current (DC) bias of the substrate holder;
   DC bias voltage supplied to at least one electrode arranged proximate the substrate holder;
   dry cleaning gas flow rate; and
   dry cleaning gas pressure.

7. The method of claim 1, wherein the adjusting further comprises adjusting
   at least one parameter of the waferless dry cleaning process based on the acquired optical emission spectra to maximize the time between wet cleans of the plasma processing chamber.

8. The method of claim 1, wherein the adjusting further comprises adjusting
   at least one parameter of the waferless dry cleaning process based on the acquired optical emission spectra to maximize the lifetime of a component of the plasma processing chamber.

9. The method of claim 1, wherein the adjusting further comprises adjusting
   at least one parameter of the waferless dry cleaning process based on the acquired optical emission spectra to minimize particle generation in the plasma processing chamber.

10. The method of claim 1, wherein the adjusting further comprises adjusting
    at least one parameter of the waferless dry cleaning process based on the acquired optical emission spectra to maximize critical dimension (CD) uniformity of a subsequently processed production substrate or lot of production substrates.

11. The method of claim 1, wherein the optimizing of the at least one parameter of the waferless dry cleaning process is performed using optical emission spectra acquired with dummy substrates placed in the plasma processing chamber.

12. The method of claim 1, wherein the optimizing of the at least one parameter of the waferless dry cleaning process is performed ex-situ.

13. The method of claim 1, wherein the optimizing of the at least one parameter of the waferless dry cleaning process is performed in-situ.

14. The method of claim 1, wherein the dry cleaning gas comprises oxygen, an oxygen-containing gas, HCl, F2, Cl2, hydrogen, nitrogen, argon, SF6, C2F6, NF3, CF4, or a mixture of two or more thereof.

15. The method of claim 1, further comprising:
    terminating the waferless dry cleaning process when the acquired optical emission spectra substantially match a predetermined target optical emission spectrum,
    wherein the target optical emission spectrum is characteristic for a plasma processing chamber for a predetermined acceptable clean condition.

16. The method of claim 1, further comprising:
    terminating the waferless dry cleaning process when content of a residual constituent approaches a determined level based on OES endpoint analysis.

* * * * *

UNITED STATES PATENT AND TRADEMARK OFFICE
CERTIFICATE OF CORRECTION

PATENT NO. : 10,773,282 B2
APPLICATION NO. : 15/469303
DATED : September 15, 2020
INVENTOR(S) : J. Brian Coppa et al.

Page 1 of 1

It is certified that error appears in the above-identified patent and that said Letters Patent is hereby corrected as shown below:

In the Claims

In Column 13, Line 7, Claim 1, after "processing chamber;" delete "and".

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*